US012364126B2

(12) United States Patent
Noh et al.

(10) Patent No.: US 12,364,126 B2
(45) Date of Patent: Jul. 15, 2025

(54) DISPLAY DEVICE

(71) Applicant: LG Display Co., Ltd., Seoul (KR)

(72) Inventors: So Young Noh, Goyang-si (KR); Kyeong Ju Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 122 days.

(21) Appl. No.: 17/521,761

(22) Filed: Nov. 8, 2021

(65) Prior Publication Data

US 2022/0149145 A1 May 12, 2022

(30) Foreign Application Priority Data

Nov. 10, 2020 (KR) ........................ 10-2020-0149302

(51) Int. Cl.

| | |
|---|---|
| *H10K 59/12* | (2023.01) |
| *H10K 59/121* | (2023.01) |
| *H10K 59/126* | (2023.01) |
| *H10K 59/131* | (2023.01) |
| *H10D 30/67* | (2025.01) |
| *H10D 86/40* | (2025.01) |
| *H10D 86/60* | (2025.01) |

(52) U.S. Cl.
CPC ..... *H10K 59/1315* (2023.02); *H10K 59/1213* (2023.02); *H10K 59/126* (2023.02); *H10D 30/6723* (2025.01); *H10D 30/6731* (2025.01); *H10D 30/6745* (2025.01); *H10D 30/6755* (2025.01); *H10D 86/423* (2025.01); *H10D 86/441* (2025.01); *H10D 86/471* (2025.01); *H10D 86/60* (2025.01)

(58) Field of Classification Search
CPC ........... H10K 59/1315; H10K 59/1213; H10K 59/126; H01L 27/1225; H01L 27/124; H01L 27/1251; H01L 29/78633
USPC .......................................................... 257/40
See application file for complete search history.

(56) References Cited

U.S. PATENT DOCUMENTS

| | | | |
|---|---|---|---|
| 5,724,107 A * | 3/1998 | Nishikawa | ........ G02F 1/136213 349/110 |
| 9,543,370 B2 | 1/2017 | Tsai et al. | |
| 11,063,068 B2 | 7/2021 | Jeon et al. | |
| 2005/0275038 A1 | 12/2005 | Shih et al. | |
| 2012/0051120 A1 | 3/2012 | Kamata | |

(Continued)

FOREIGN PATENT DOCUMENTS

| | | |
|---|---|---|
| JP | 2010232651 A | 10/2010 |
| JP | 2012074125 A | 4/2012 |

(Continued)

*Primary Examiner* — Ori Nadav
(74) *Attorney, Agent, or Firm* — Seed IP Law Group LLP

(57) ABSTRACT

A display device includes a substrate, first thin film transistors and second thin film transistors. A gate line is formed integrally with a first gate electrode of the first thin film transistors. An isolation insulating layer is disposed over a first gate insulating layer of the first thin film transistors. A second active layer of the second thin film transistors is disposed on the isolation insulating layer. An overlap pattern is disposed on the isolation insulating layer to be connected to the gate line. The overlap pattern includes a first overlap pattern disposed on the isolation insulating layer and formed of substantially the same material as the second active layer. A second overlap pattern is disposed on the first overlap pattern.

20 Claims, 9 Drawing Sheets

(56) References Cited

U.S. PATENT DOCUMENTS

| | | | |
|---|---|---|---|
| 2013/0037884 A1* | 2/2013 | Yamazaki | H01L 29/40114 |
| | | | 257/347 |
| 2013/0187150 A1 | 7/2013 | Yamazaki et al. | |
| 2016/0111053 A1* | 4/2016 | Yamazaki | H01L 27/1225 |
| | | | 345/99 |
| 2018/0006258 A1 | 1/2018 | Kim et al. | |
| 2018/0033848 A1* | 2/2018 | Jung | H10K 59/122 |
| 2018/0204856 A1* | 7/2018 | Noh | G02F 1/136286 |
| 2019/0232627 A1 | 8/2019 | Katsuno et al. | |
| 2020/0219988 A1 | 7/2020 | Kimura | |
| 2020/0258974 A1* | 8/2020 | Zhang | H10K 59/123 |

FOREIGN PATENT DOCUMENTS

| | | |
|---|---|---|
| JP | 2013168646 A | 8/2013 |
| JP | 2017536646 A | 12/2017 |
| JP | 2020076975 A | 5/2020 |
| JP | 2021183421 A | 12/2021 |
| KR | 20190030840 A | 3/2019 |
| TW | 201804220 A | 2/2018 |
| TW | 201828494 A | 8/2018 |
| WO | WO 2019064744 A1 | 4/2019 |
| WO | 2019187078 A1 | 10/2019 |

* cited by examiner

DISPLAY DEVICE

This application claims the benefit of Korean Patent Application No. 10-2020-0149302, filed on Nov. 10, 2020, which is hereby incorporated by reference as if fully set forth herein.

BACKGROUND

Technical Field

The present disclosure relates to a display device.

Description of the Related Art

Image displays, which display various pieces of information through a screen, are core technology in the age of information and communication, and are being developed towards thinness, light weight, portability and high performance. Accordingly, various display devices, such as liquid crystal displays (LCDs), electroluminescent displays (ELDs) and quantum dot (QD) displays, are being used now.

Among electroluminescent displays (ELDs), an organic light emitting display (OLED) in which an emission layer uses an organic material is mainly used. The organic light emitting display (OLED), which is a self-light emitting device, has low power consumption, a high response speed, high luminous efficacy, high luminance and a wide viewing angle. The organic light emitting display (OLED) displays an image through a plurality of subpixels arranged in a matrix. Each of the subpixels includes a light emitting device, and a pixel circuit including a plurality of transistors configured to independently drive the light emitting device.

Such an organic light emitting display (OLED) is being developed to increase the resolution and size thereof, in order to provide image information of high quality.

However, as the resolution and size of the organic light emitting display (OLED) are increased, resistance of wirings in a panel is increased. As the resistance of the wirings is increased, it is difficult to cope with high-speed driving of the organic light emitting display (OLED).

BRIEF SUMMARY

Accordingly, the embodiments are directed to a display device that substantially obviates one or more problems due to limitations and disadvantages of the related art.

A technical feature of the embodiments is to provide a display device which may reduce the resistance of a wiring having increased resistance by forming an overlap pattern disposed so as to overlap the wiring having increased resistance or disposed adjacent thereto, and then connecting the overlap pattern to the wiring having increased resistance, so as to improve driving speed.

Additional advantages and features of the embodiments will be set forth in part in the description which follows and in part will become apparent to those having ordinary skill in the art upon examination of the following or may be learned from practice of the embodiments. The technical features and other advantages of the embodiments may be realized and attained by the structure particularly pointed out in the written description and claims hereof as well as the appended drawings.

To achieve these technical features and other advantages and in accordance with the purpose of the embodiments, as broadly described herein, a display device includes a substrate including an active area and a non-active area, first thin film transistors, each of the first thin film transistors including a first active layer disposed in the active area, a first gate insulating layer disposed on the first active layer, a first gate electrode disposed on the first gate insulating layer and disposed so as to overlap the first active layer, and a first source electrode and a first drain electrode formed through the first gate insulating layer so as to be connected to the first active layer, a gate line formed integrally with the first gate electrode, an isolation insulating layer disposed on the first gate insulating layer second thin film transistors disposed in the active area, each of the second thin film transistors including a second active layer disposed on the isolation insulating layer, a second gate insulating layer disposed on the second active layer, a second gate electrode disposed on second gate insulating layer and disposed so as to overlap the second active layer, a second interlayer insulating layer provided on the second gate insulating layer and the second gate electrode, and a second source electrode and a second drain electrode formed through the second gate insulating layer and the second interlayer insulating layer so as to be connected to the second active layer, and an overlap pattern disposed on the isolation insulating layer and connected to the gate line, wherein the overlap pattern includes a first overlap pattern disposed on the isolation insulating layer and formed of substantially the same material as the second active layer, and a second overlap pattern disposed on the first overlap pattern.

At least one contact hole configured to connect the first overlap pattern and the gate line to each other may be disposed in the isolation insulating layer.

The at least one contact hole may be disposed in the active area.

The first overlap pattern and the second active layer may be formed of an oxide semiconductor.

The second overlap pattern may be formed of at least one of Mo/Ti, MoTi/Cu/MoTi, Mo/Al/Mo or Ti/Al/Ti.

The overlap pattern may have a smaller width than a width of the gate line and be completely overlapped by the gate line.

The overlap pattern may further include an overlap pattern line and an overlap pattern electrode, the overlap pattern electrode may be disposed so as to overlap the first gate electrode, and the overlap pattern line may be disposed so as to overlap the gate line.

The gate line may have a smaller width than a width of the overlap pattern and be completely overlapped by the overlap pattern.

The overlap pattern and the gate line may be spaced apart from each other so as to be disposed substantially parallel to each other, the gate line may include gate branch parts configured to protrude from a length direction of the gate line towards the overlap pattern, and a contact hole configured to connect each of the gate branch parts to the overlap pattern may be formed in a region in which each of the gate branch parts overlaps a part of the overlap pattern.

The overlap pattern and the gate line may be spaced apart from each other so as to be disposed substantially parallel to each other, the gate line may include gate branch parts configured to protrude from a length direction of the gate line towards the overlap pattern, connection patterns may be formed in the same layer as the second gate electrode, and each of the connection patterns may be configured to: be connected to a corresponding one of the gate branch parts by a first contact hole formed in a first overlap region in which each of the connection patterns overlaps the corresponding one of the gate branch parts, and be connected to the overlap pattern by a second contact hole formed in a second overlap region in which each of the connection patterns overlaps the overlap pattern.

One side of each of the connection patterns may be connected to the second overlap pattern of the overlap pattern in the second overlap region.

The first contact hole may be formed through the second gate insulating layer and the isolation insulating layer in the first overlap region.

The second contact hole may be formed through the second gate insulating layer in the second overlap region in which the overlap pattern and each of the connection patterns overlap each other.

The second gate electrode and the connection patterns may be disposed on the second gate insulating layer.

The connection patterns may connect the gate line and the overlap pattern to each other.

The display device may further include a first extension line and a second extension line disposed in the active area and configured to extend from the gate line towards the non-active area, an extension overlap pattern disposed in the active area and overlapping the gate line, and configured to extend from the overlap pattern towards the non-active area so as to overlap the first extension line, and a link line disposed in a link region of the non-active area so as to overlap the second extension line, and the link region may include a third contact hole configured to connect the link line to the second extension line, and a fourth contact hole configured to connect the extension overlap pattern to the first extension line.

The third contact hole and the fourth contact hole may be formed through the isolation insulating layer.

The first extension line may be disposed so as to be connected to the gate line, and the second extension line may be disposed so as to be connected to the first extension line.

It is to be understood that both the foregoing summary and the following detailed description of the embodiments are examples intended to provide illustration of the embodiments.

BRIEF DESCRIPTION OF THE SEVERAL VIEWS OF THE DRAWINGS

The accompanying drawings, which are included to provide a further understanding of the embodiments and are incorporated in and constitute a part of this application, illustrate embodiment(s) of the disclosure and together with the description serve to explain the features of the embodiments. In the drawings.

DETAILED DESCRIPTION

Figure 1:
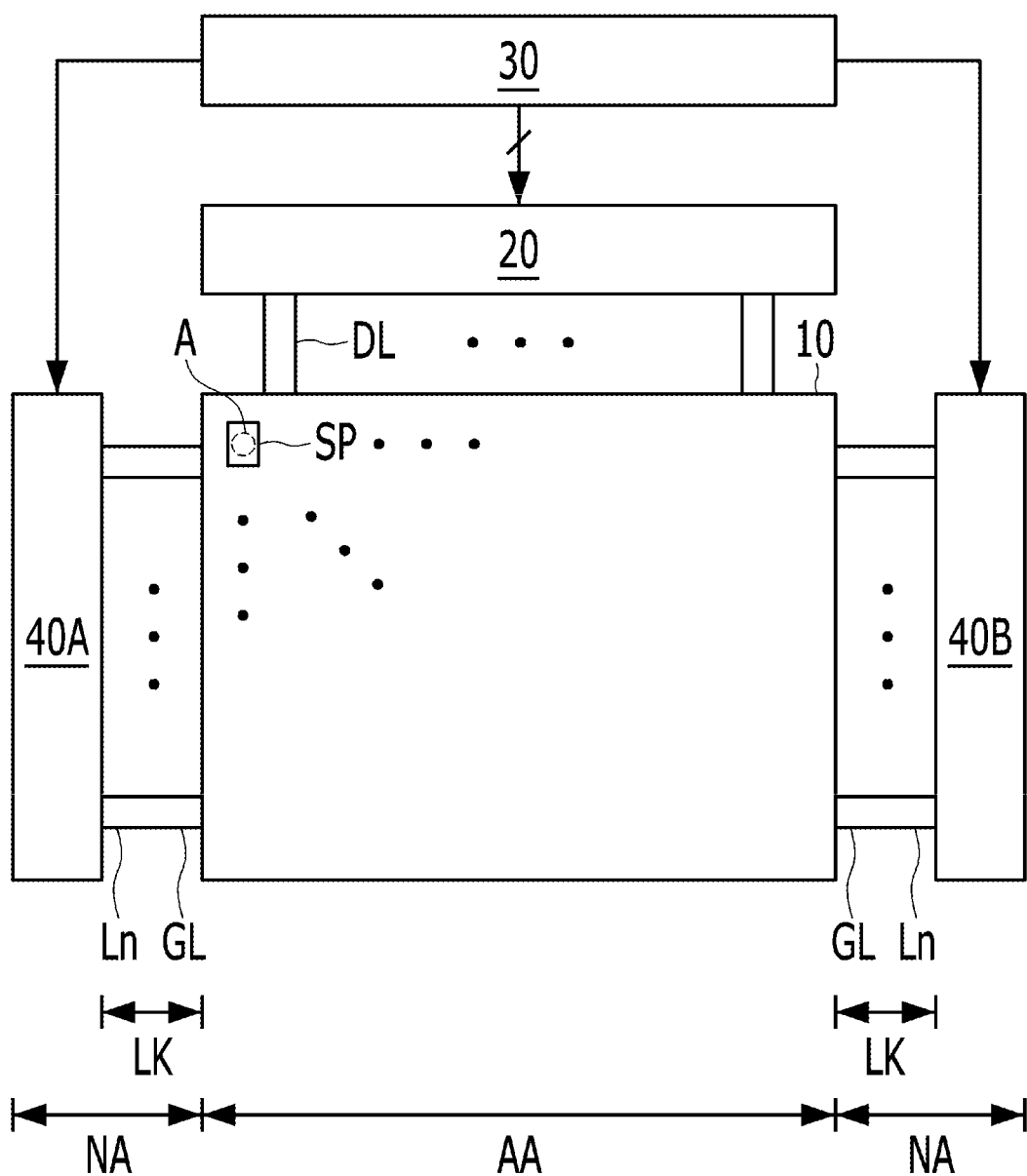
FIG. 1 is a plan view illustrating the schematic structure of a display device according to one embodiment.

Reference will now be made in detail to the embodiments, examples of which are illustrated in the accompanying drawings. In the following description of the embodiments and the drawings, the same or similar elements are denoted by the same reference numerals throughout the specification. In the following description of the embodiments, a detailed description of known functions and configurations incorporated herein will be omitted when it may make the subject matter of the embodiments unclear. Further, in the following description of the embodiments, elements of several embodiments, which are substantially the same, will be described at once in the first embodiment, and then a redundant description thereof will be omitted in other embodiments because it is considered to be unnecessary.

In the following description of the embodiments, it will be understood that, when the terms "first," "second," etc., are used to describe various elements, and these elements are not limited by these terms. These terms are used merely to distinguish the same or similar elements.

Respective features of the various embodiments of may be partially or wholly coupled to or combined with each other and be interlocked or driven in various technical manners, and the respective embodiments may be implemented independently of each other or be implemented together through connection therebetween.

Hereinafter, embodiments will be described in detail with reference to the accompanying drawings.

Figure 2:
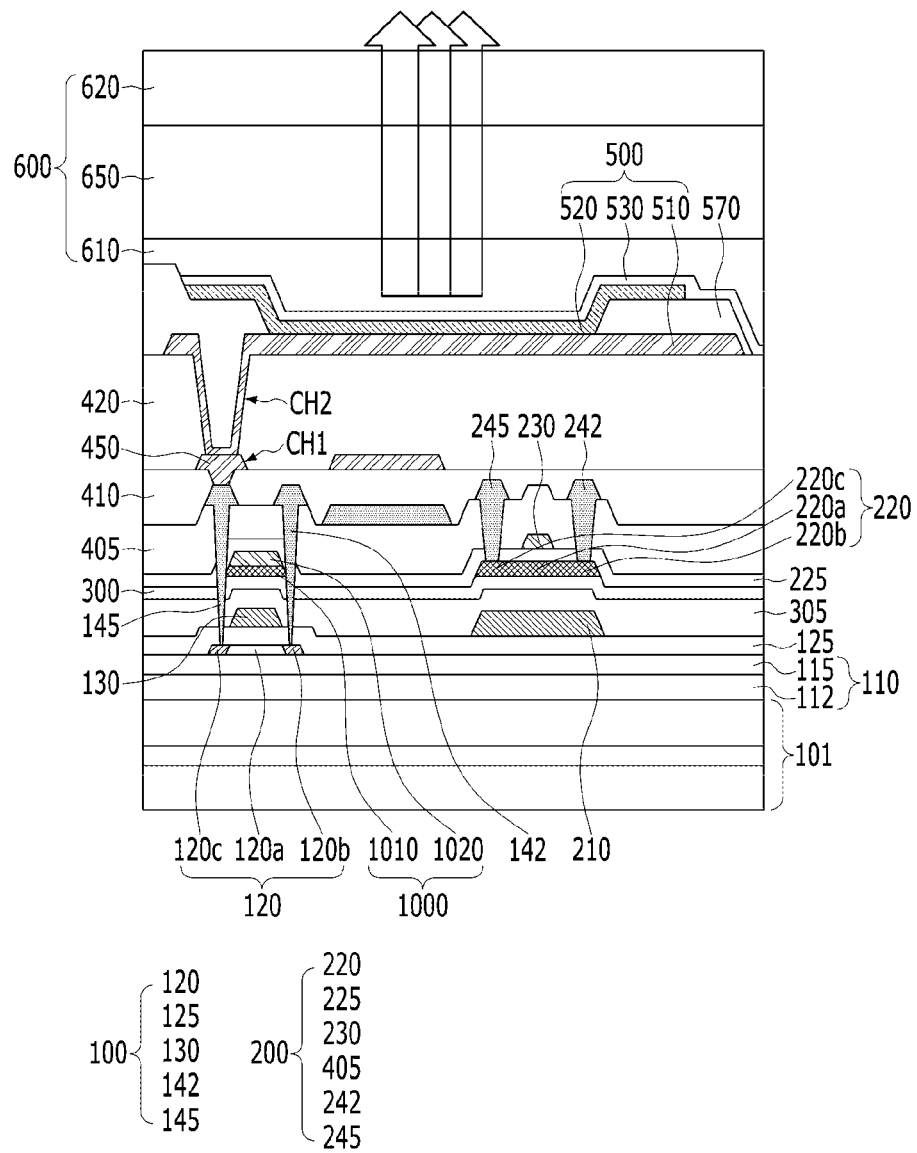
FIG. 2 is a longitudinal-sectional view of the display device according to one embodiment.
Figure 3:
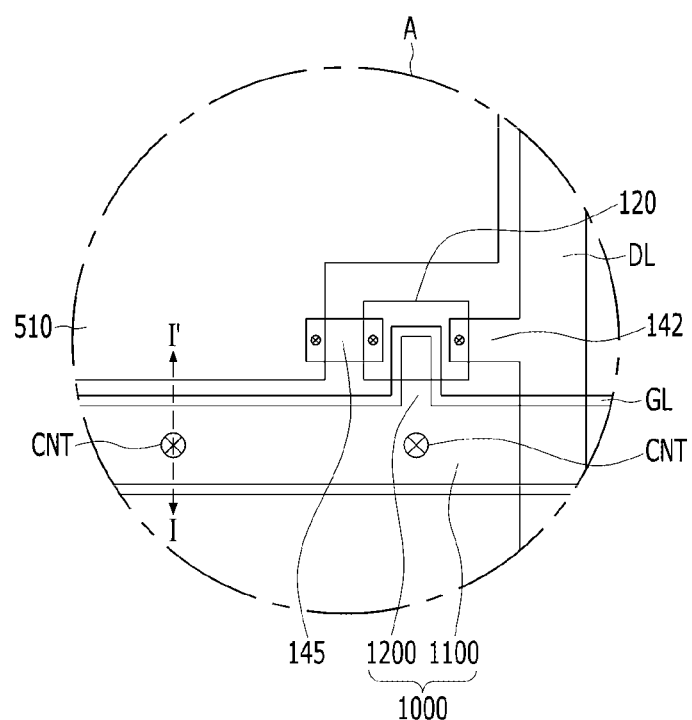
FIG. 3 is an enlarged plan view of region A of FIG. 1.
Figure 4:
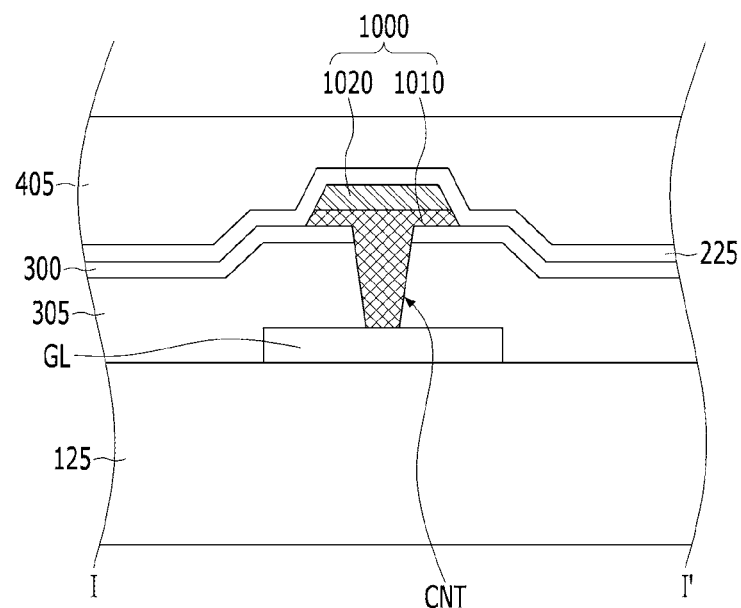
FIG. 4 is a longitudinal-sectional view taken along line I-I' of FIG. 3.

FIG. 1 is a plan view illustrating the schematic structure of a display device according to one embodiment, FIG. 2 is a longitudinal-sectional view of the display device according to one embodiment, FIG. 3 is an enlarged plan view of region A of FIG. 1, and FIG. 4 is a longitudinal-sectional view taken along line I-I' of FIG. 3.

As shown in FIGS. 1 to 4, a display device according to one embodiment includes a display panel 10 configured to display an image, and a panel driver configured to drive the display panel 10. The panel driver includes a data driver 20, gate drivers 40A and 40B, and a timing controller 30.

The timing controller 30 may generate data control signals and gate control signals for respectively controlling driving timings of the data driver 20 and the gate drivers 40A and 40B, and may supply the data control signals and the gate control signals to the date driver 20 and the gate drivers 40A and 40B. The timing controller 30 may process image data and supply the processed image data to the data driver 20.

The data driver 20 may be controlled by the data control signal supplied from the timing controller 30, and may convert the image data supplied from the timing controller 30 into analog data signals, and may supply the analog data signals to data lines DL of the display panel 10.

The gate drivers 40A and 40B may be implemented as gate in panel (GIP) circuits directly formed in a thin film transistor-type in non-active areas NA. The gate drivers 40A and 40B may be disposed in the non-active area NA located at at least one of left and right sides of the display panel 10.

The gate drivers 40A and 40B may output gate signals while shifting the level of gate voltage in response to the gate control signals supplied from the timing controller 30. The gate drivers 40A and 40B may output the gate signals through gate lines GL.

Here, link regions LK in which the gate lines GL of the display panel 10 are connected to the gate drivers 40A and 40B may be disposed. Concretely, output lines (45 in FIG. 11) of the gate drivers 40A and 40B may extend towards the link regions LK, and the gate lines GL may extend towards the link regions LK. Although the output lines of the gate drivers 40A and 40B and the gate lines GL may be connected by link lines Ln in the link regions LK, the disclosure is not limited thereto, and the output lines and the gate lines GL may be formed integrally.

The display panel 10 includes an active area AA configured to implement a screen on which an input image is displayed and the non-active area NA located at at least one side of the active area AA.

The non-active area NA is a region in which the input image is not displayed, and subpixels SP may not be disposed and signal lines and the gate drivers 40A and 40B may be disposed in the non-active areas NA.

In the active area AA, the subpixels SP connected to the data lines DL and the gate lines GL overlapping each other may be arranged in a matrix. Each of the subpixels SP includes, as shown in FIG. 2, a light emitting device 500, and at least one driving transistor 100 and at least one switching transistor 200 conductively connected to the light emitting device 500.

A substrate 101 configured to support the switching transistor 200 and the driving transistor 100 may include a plurality of polyimide (PI) layers. When the substrate 101 is formed of polyimide (PI), a process for fabricating the display device may be executed in the state in which a support substrate formed of glass is disposed under the substrate 101, and after the process for fabricating the display device is completed, the support substrate may be released from the substrate 101. Further, when the support substrate is released from the substrate 101, a back plate configured to support the substrate 101 may be disposed under the substrate 101. Further, the substrate 101 may be formed of glass or a plastic material having flexibility.

A buffer layer 110 including a multi-buffer layer 112 and a lower buffer layer 115 may be disposed on the substrate 101. The multi-buffer layer 112 may delay diffusion of moisture and/or oxygen penetrated into the substrate 101. The multi-buffer layer 112 may be formed by alternately stacking a silicon nitride ($SiN_x$) layer and a silicon oxide ($SiO_x$) layer at least once.

The lower buffer layer 115 may function to protect a second active layer 220 and to cut off various kinds of defects introduced from the substrate 101. The lower buffer layer 115 may be formed of a-Si, silicon nitride ($SiN_x$), a silicon oxide ($SiO_x$), or the like.

The driving transistor 100 may be disposed on the buffer layer 110. The driving transistor 100 may be operated in response to data voltage stored in a storage capacitor such that driving current flows between a high voltage supply line and a low voltage supply line. The driving transistor 100 may include, as shown in FIG. 2, a first gate electrode 130 conductively connected to a second drain electrode of the switching transistor 200, a first source electrode 142 connected to the high voltage supply line, a first drain electrode 145 connected to the light emitting device 500, and an first active layer 120 configured to form a channel between the first source electrode 142 and the first drain electrode 145.

That is to say, the driving transistor 100 may include the first active layer 120, the first gate electrode 130, the first source electrode 142 and the first drain electrode 145, and may further include an overlap pattern 1000 connected to the gate line GL formed integrally with the first gate electrode 130.

The first active layer 120 of the driving transistor 100 may be disposed on the buffer layer 110. The first active layer 120 may include low temperature polysilicon (LTPS). Because a polysilicon material has high mobility (equal to or greater than 100 $cm^2/Vs$) and thus has low energy consumption and excellent reliability, the polysilicon material may be applied to a gate driver and/or a multiplexer for driving devices, which drive thin film transistors for display devices, and may be applied to the first active layer 120 of the driving transistor 100 in the display device according to one embodiment. An amorphous silicon (a-Si) material may be deposited on the buffer layer 110, a polysilicon layer may be formed by executing a dehydrogenation process and a crystallization process, and the first active layer 120 may be formed by patterning the polysilicon layer.

The first active layer 120 may include a first channel region 120a in which a channel is formed when the driving transistor 100 is driven, and a first source region 120b and a first drain region 120c located at both sides of the first channel region 120a. The first source region 120b means a portion of the first active layer 120 connected to the first source electrode 142, and the first drain region 120c means a portion of the first active layer 120 connected to the first drain electrode 145. The first channel region 120a, the first source region 120b and the first drain region 120c may be formed by performing ion-doping (impurity-doping) of the first active layer 120. The first source region 120b and the first drain region 120c may be formed by doping the first active layer 120 formed of a polysilicon material with ions serving as a dopant. Here, the first channel region 120a may be a portion of the first active layer 120 formed of the polysilicon material, which is not doped.

A first gate insulating layer 125 may be disposed on the first active layer 120 of the driving transistor 100. The first gate insulating layer 125 may be formed as a single layer structure including a silicon nitride ($SiN_x$) layer or a silicon oxide ($SiO_x$) layer, or may be formed as a multilayer structure including a silicon nitride ($SiN_x$) layer and a silicon oxide ($SiO_x$) layer. Contact holes configured to respectively connect the first source electrode 142 and the first drain electrode 145 of the driving transistor 100 to the first source region 120b and the first drain region 120c of the first active layer 120 may be formed in the first gate insulating layer 125.

The first gate electrode 130 of the driving transistor 100 is disposed on the first gate insulating layer 125. The first gate electrode 130 may be formed by forming a metal layer formed of molybdenum (Mo) or the like on the first gate insulating layer 125 and then pattering the metal layer. The first gate electrode 130 may be disposed on the first gate insulating layer 125 so as to overlap the first channel region 120a of the first active layer 120 of the driving transistor 100.

Here, when the first gate electrode 130 is formed on the first gate insulating layer 125, a light-shielding pattern 210 may be further disposed in a region in which the switching transistor 200 is disposed. The light-shielding pattern 210 may be disposed so as to prevent the second active layer 220, which will be described below, from being exposed to light.

An first interlayer insulating layer 305 may be disposed on the first gate insulating layer 125 and the first gate electrode 130. The first interlayer insulating layer 305 is used as an insulating layer for insulating the first gate electrode 130 and the first active layer 120 from a upper layers of the first gate electrode 130 and stabilize the first active layer 120 during heat treatment of the first active layer 120. The first interlayer insulating layer 305 may be formed of, for example, silicon nitride ($SiN_x$ so as to provide hydrogen to the first active layer 120 of the driving transistor 100 during the hydrogenation process of the first active layer 120.

An isolation insulating layer 300 may be disposed on the first interlayer insulating layer 305. The isolation insulating layer 305 may be formed of, for example, silicon oxide ($SiO_x$) so as to prevent hydrogen ions from being introduced into the second active layer 220. If the second active layer 220 is an oxide semiconductor layer, introduction of hydrogen ions into the second active layer 220 may cause degradation of normally-off characteristics. Therefore, the isolation insulating layer 300 formed of an oxide insulating material for preventing hydrogen ions from being introduced into the second active layer 220 is disposed. The isolation insulating layer 300 may be used for a buffer film configured to form the switching transistor 200. Further, contact holes configured to expose the first source region 120b and the first drain region 120c of the first active layer 120 of the driving transistor 100 may be formed in the isolation layer 300, the first interlayer insulating layer 305 and the first gate insulating layer 125.

The second active layer 220 of the switching transistor 200 may be disposed on the isolation insulating layer 300. Further, the overlap pattern 1000 may be disposed on the isolation insulating layer 300 in a region in which the driving transistor 100 is formed.

The overlap pattern 1000 may include a first overlap pattern 1010 and a second overlap pattern 1020 disposed on the gate line GL and/or the first gate electrode 130 so as to overlap each other.

The first overlap pattern 1010 may be formed of substantially the same material as a material of the second active layer 220 on the isolation insulating layer 300. The second overlap pattern 1020 may be formed of a single metal or a plurality of metals on the first overlap pattern 1010.

Referring to FIGS. 3 and 4, the overlap pattern 1000 may be disposed so as to overlap the gate line GL and the first gate electrode 130. The overlap pattern 1000 may include an overlap pattern line 1100 and an overlap pattern electrode 1200. The overlap pattern electrode 1200 may be disposed so as to overlap the first gate electrode 130. Further, in another embodiment which will be described later, the overlap pattern electrode 1200 may not be disposed so as to overlap the first gate electrode 130, and may be disposed so as to serve as a branch part connected to the gate line GL. Here, the overlap pattern electrode 1200 may be selectively formed.

The overlap patterns 1000 may be disposed in the active area AA, and may have a smaller width than the width of the gate lines GL. Therefore, the overlap pattern 1000 may be disposed so as to be completely overlapped by the gate lines GL.

The overlap pattern 1000 may be connected to the gate line GL through contact holes CNT. The contact holes CNT may be formed through the isolation insulating layer 300 and the first interlayer insulating layer 305 in a region in which the overlap pattern 1000 and the gate line GL overlap each other. The contact holes may be provided in plural so as to connect the overlap pattern 1000 and the gate line GL to each other. Although these figures illustrate the first interlayer insulating layer 305, the first interlayer insulating layer 305 may be selectively disposed on the isolation insulating layer 300.

The gate line GL may be connected to the first overlap pattern 1010, and the second overlap pattern 1020 may be disposed on the first overlap pattern 1010. The first overlap pattern 1010 may be formed of an oxide semiconductor in the same manner as the second active layer 220. The second overlap pattern 1020 may be formed of at least one of Mo/Ti, MoTi/Cu/MoTi, Mo/Al/Mo and Ti/Al/Ti. "Mo/Ti" may refer to a multilayer structure including at least one layer of molybdenum and one layer of titanium. "MoTi/Cu/MoTi" may refer to a multilayer structure including at least one layer of copper sandwiched between at least two layers of an alloy of molybdenum and titanium. "Mo/Al/Mo" may refer to a multilayer structure including at least one layer of aluminum sandwiched between at least two layers of molybdenum. "Ti/Al/Ti" may refer to a multilayer structure including at least one layer of aluminum sandwiched between at least two layers of titanium.

Therefore, in the display device according to one embodiment, the overlap patterns 1000 are connected to the gate lines GL, thus being capable of serving as redundancies of the gate lines GL. That is, the overlap patterns 1000 may reduce resistance of the gate lines GL, and may thus cope with high-speed driving of the display device.

Next, the switching transistor 200 may include the second active layer 220, a second gate electrode 230, a second gate insulating layer 225, a second source electrode 242 and a second drain electrode 245.

The second active layer 220 disposed on the isolation insulating layer 300 may be formed of an oxide semiconductor. Because an oxide semiconductor material has a greater band gap than a silicon material, electrons may not pass the band gap thereof in an off state, and thus the oxide semiconductor material has a low off-current. Therefore, a thin film transistor including an active layer formed of an oxide semiconductor may have a short on-time and a long off-time. Therefore, such a thin film transistor is suitable to execute a switching operation. Further, because the off-current of this thin film transistor is low, the magnitude of auxiliary capacitance may be reduced, and thus, the thin film transistor is suitable for a high-resolution display device. Concretely, the second active layer 220 may be formed of a metal oxide, for example, an oxide of various metals, such as indium-gallium-zinc-oxide.

The second active layer 220 may be formed by depositing a metal oxide on the isolation insulating layer 300, performing a heat-treatment process for stabilization, and then patterning the metal oxide. The second active layer 220 may include a second channel region 220a in which a channel is formed when the switching transistor 200 is driven, and a second source region 220b and a second drain region 220c located at both sides of the second channel region 220a. The second source region 220b means a portion of the second active layer 220 connected to the second source electrode 242, and the second drain region 220c means a portion of the second active layer 220 connected to the second drain electrode 245. The second channel region 220a, the second source region 220b and the second drain region 220c may be formed by performing ion-doping (impurity-doping) of the second active layer 220. The second source region 220b and the second drain region 220c may be formed by ion-doping the second active layer 220.

The second gate insulating layer 225 may be disposed on the second active layer 220, the overlap patterns 1000 and the isolation insulating layer 300. The second gate insulating layer 225 may be formed as a single layer structure including a silicon nitride (SiN$_x$) layer or a silicon oxide (SiO$_x$) layer, or may be formed as a multilayer structure including a silicon nitride (SiN$_x$) layer and a silicon oxide (SiO$_x$) layer. As another example, the second gate insulating layer 225 may be patterned so as to overlap the second channel region 220a of the second active layer 220.

The second gate electrode 230 may be disposed on the second gate insulating layer 225. The second gate electrode 230 may be formed by forming a metal layer formed of molybdenum (Mo) or the like on the second gate insulating layer 225 and then pattering the metal layer. The second gate electrode 230 may be patterned so as to overlap the second channel region 220a of the second active layer 220 and the second gate insulting layer 225.

A second interlayer insulating layer 405 may be disposed on the second gate electrode 230 and the second gate insulating layer 225. The second interlayer insulating layer 405 may be a passivation layer. Contact holes configured to expose the first source electrode 142, the first drain electrode 145, the second source electrode 242 and the second drain electrode 245 may be formed through the second gate insulating layer 225 and the second interlayer insulating layer 405.

The light emitting device 500 includes an anode 510, a cathode 530, and an emission stack 520 formed between the anode 510 and the cathode 530.

The anodes 510 of the respective subpixels may be disposed on a second planarization layer 420 independently of each other. The anode 510 may be connected to a pixel connection electrode 450 exposed through a second pixel contact hole CH2 formed through the second planarization layer 420. Here, the pixel connection electrode 450 may be connected to the first drain electrode 145 exposed through a first pixel contact hole CH1 formed through a first planarization layer 410.

The anode 510 may be disposed on the second planarization layer 420 so as to overlap not only an emission region bordered by a bank 570 but also at least one of the driving transistor 100 and the switching transistor 200, thereby being capable of increasing an emission area.

The bank 570 is formed to expose the anodes 510 of the respective subpixels, thus forming the emission areas of the respective subpixels. The bank 570 may be formed of an opaque material, (for example, a material in black) in the active area AA so as to prevent optical interference between adjacent subpixels, or may be formed in the non-active area NA in addition to the active area AA so as to overlap the gate drivers 40A and 40B. In this case, the bank 570 may include a light-shielding material including at least one of color pigments, organic black and carbon.

The emission stack 520 may be formed by stacking a hole-relating layer, an organic emission layer and an electron-relating layer on the anode 510 in this order or in reverse order. The emission stack 520 is formed by a manufacturing process using a fine metal mask (FMM). Here, spacers may be further disposed on the bank 570 in order to prevent damage to adjacent emission stacks 520 and/or the bank 570 due to the fine metal mask (FMM). The spacers may be formed of substantially the same material as the bank 570 or the first and second planarization layers 410 and 420.

The cathode 530 may be formed on the upper and side surfaces of the emission stack 520 so as to be opposite the anode 510 with the emission stack 520 interposed therebetween. The cathode 530 may be formed in common throughout all of the subpixels disposed in the active area AA so as to be shared by the subpixels. An encapsulation unit 600 is disposed on the substrate 101 provided with the cathode 530 formed thereon. The encapsulation unit 600 may be an encapsulation structure 600, and may be referred to as an encapsulation structure 600.

The encapsulation unit 600 may prevent external moisture or oxygen from penetrating into the light emitting devices 500 which are vulnerable to external moisture or oxygen. For this purpose, the encapsulation unit 600 includes a plurality of inorganic encapsulation layers 610 and 620, and an organic encapsulation layer 650 disposed between the inorganic encapsulation layers 610 and 620, and the inorganic encapsulation layer 620 is disposed as the uppermost layer. Here, the encapsulation unit 600 may include at least two inorganic encapsulation layers 610 and 620 and at least one organic encapsulation layer 650. In the embodiments, the structure of the encapsulation unit 600 in which the organic encapsulation layer 650 is disposed between the first and second inorganic encapsulation layers 610 and 620 will be described as an example.

The organic encapsulation layer 650 disposed between the inorganic encapsulation layers 610 and 620 may serve as a buffer layer which relieves stress between the respective inorganic encapsulation layers 610 and 620, and may strengthen planarization performance. In some examples, the organic encapsulation layer 650 may serve to relieve stress caused by bending of a bendable display device. The organic encapsulation layer 650 may be formed of an organic insulating material, such as an acrylic resin, an epoxy resin, polyimide, polyethylene, polycaprolactone (PCL) or silicon oxycarbide (SiOC).

The first inorganic encapsulation layer 610 is formed on the substrate 101 provided with the cathode 530 formed thereon so as to be closest to the light emitting devices 500. The first inorganic encapsulation layer 610 may be formed of an inorganic insulating material which may be deposited at a low temperature, such as silicon nitride (SiN$_x$), silicon oxide (SiO$_x$), silicon oxynitride (SiON) or aluminum oxide (Al$_2$O$_3$). Therefore, because the first inorganic layer 610 is formed by deposition in a low-temperature atmosphere, damage to the emission stack 520 vulnerable to a high-temperature atmosphere during the deposition process of the first inorganic encapsulation layer 610 may be prevented.

The second inorganic encapsulation layer 620 is formed on the substrate 101 provided with the organic encapsulation layer 650 formed thereon so as to cover the upper and side surfaces of the organic encapsulation layer 650 and the first inorganic encapsulation layer 610. The second inorganic encapsulation layer 620 minimizes, reduces or prevents penetration of external moisture or oxygen into the first inorganic encapsulation layer 610 or the organic encapsulation layer 650. The second inorganic encapsulation layer 620 may be formed of an inorganic insulating material, such as silicon nitride (SiN$_x$), silicon oxide (SiO$_x$), silicon oxynitride (SiON) or aluminum oxide (Al$_2$O$_3$).

As such, in the display device according to one embodiment, the overlap patterns 1000 are disposed so as to overlap the gate lines GL, and are connected to the gate lines GL, thus being capable of serving as redundancies of the gate lines GL. Therefore, the overlap patterns 1000 disposed so as to overlap the gate lines GL are connected to the gate lines GL, thus being capable of reducing resistance of the gate lines GL and thereby improving the driving speed of the display device.

Figure 5:
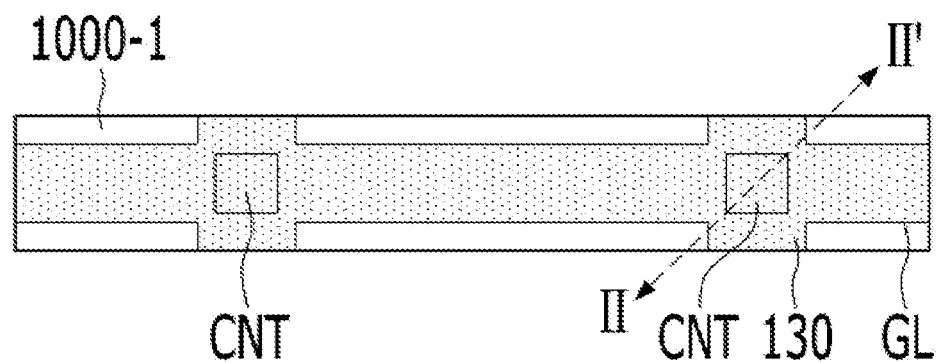
FIG. 5 is a plan view illustrating a display device according to another embodiment.
Figure 6:
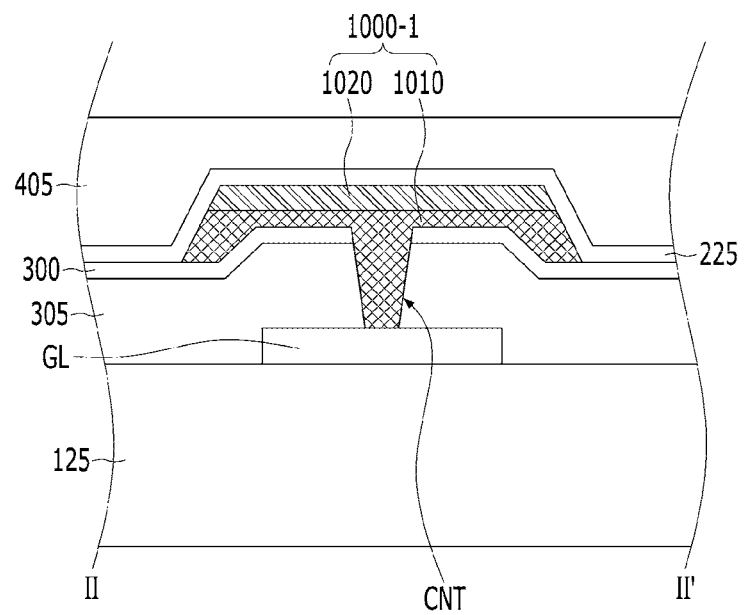
FIG. 6 is a longitudinal-sectional view taken along line II-IF of FIG. 5.

FIG. 5 is a plan view illustrating a display device according to another embodiment, and FIG. 6 is a longitudinal-sectional view taken along line II-IF of FIG. 5.

Here, a detailed description of some parts in this embodiment show in FIGS. 5 and 6 which are substantially the same as those in the former embodiment shown in FIGS. 1 to 4 will be omitted because it is considered to be unnecessary, and FIGS. 1 to 4 will be cited for ease of description.

Referring to FIGS. 5 and 6, overlap patterns 1000-1 according to another embodiment may be disposed so as to be formed in a greater area than the width of gate lines GL. The gate lines GL may have a smaller width than the width of the overlap patterns 1000-1 so as to be completely overlapped by the overlap patterns 1000-1. That is, the overlap patterns 1000-1 may have a greater width than the width of the gate lines GL, and thus, the gate lines GL may by completely overlapped by the overlap patterns 1000-1.

On an isolation insulating layer 300, a second active layer 220 may be disposed in a region in which a switching transistor 200 is formed, and the overlap pattern 1000-1 may be disposed in a region in which a driving transistor 100 is formed, so as to be formed in a greater area than the width of the gate line GL.

The overlap pattern 1000-1 may include a first overlap pattern 1010 and a second overlap pattern 1020, which are disposed on the gate line GL and a first gate electrode 130 so as to overlap each other.

The first overlap pattern 1010 may be formed of substantially the same material as a material of the second active layer 220 on the isolation insulating layer 300. The first overlap pattern 1010 and the second active layer 220 may be formed of an oxide semiconductor. The second overlap pattern 1020 may be formed of a single metal or a plurality of metals on the first overlap pattern 1010. The second overlap pattern 1020 may be formed of at least one of Mo/Ti, MoTi/Cu/MoTi, Mo/Al/Mo and Ti/Al/Ti.

The overlap pattern 1000-1 may be disposed so as to overlap the gate line GL and the first gate electrode 130. The overlap pattern 1000-1 may be disposed so as to correspond to a part of the first gate electrode 130.

The overlap pattern 1000-1 may be connected to the gate line GL through contact holes CNT. A plurality of contact holes CNT may be formed in the isolation insulating layer 300 and a first interlayer insulating layer 305 in a region in which the overlap pattern 1000-1 and the gate line GL overlap each other, thereby being capable of connecting the overlap pattern 1000-1 to the gate line GL. Although these figures illustrate the first interlayer insulating layer 305, the first interlayer insulating layer 305 may be selectively disposed on the isolation insulating layer 300.

The gate line GL may be connected to the first overlap pattern 1010 through the contact holes CNT, and the second overlap pattern 1020 may be disposed on the first overlap pattern 1010.

As such, in the display device according to another embodiment, the overlap patterns 1000-1 are connected to the gate lines GL, thus being capable of serving as redundancies of the gate lines GL. That is, the overlap patterns 1000-1 have a greater width than the width of the gate lines GL, and may thus further reduce resistance of the gate lines GL, thereby being capable of coping with high-speed driving of the display device.

Further, the overlap pattern 1000-1 secures a greater area than the width of the gate line GL in the region of the gate line GL in which the gate electrode 130 is formed, thus being capable of realizing ease of formation of the contact hole CNT.

Therefore, in the display device according to another embodiment, the overlap patterns 1000-1 are disposed on the driving transistors 100 so as to be formed in a greater area than the width of the gate lines GL, and are connected to the gate lines GL, thus being capable of further reducing resistance of the gate lines GL and thereby improving the driving speed of the display device.

Figure 7:
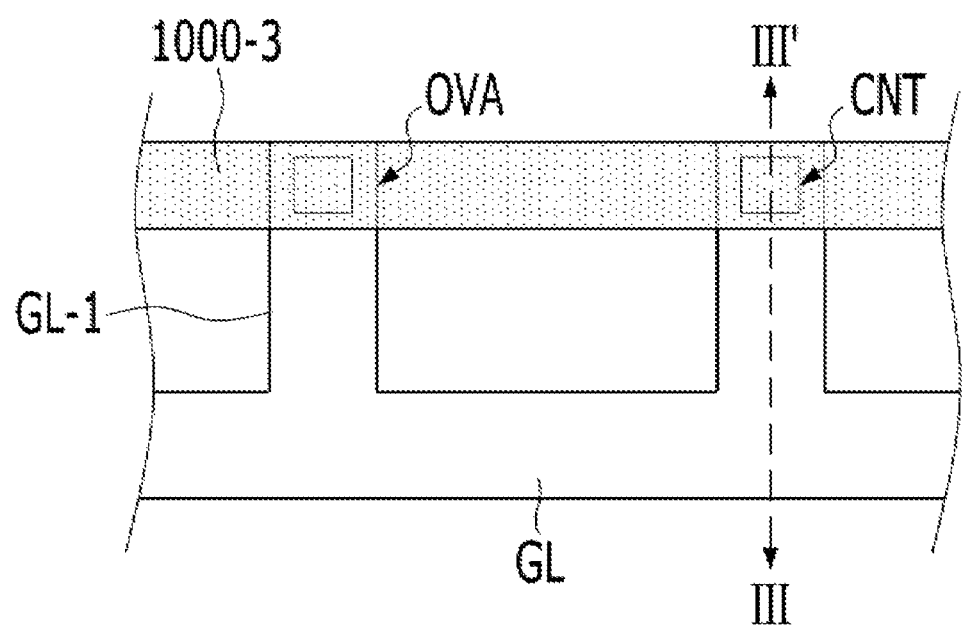
FIG. 7 is a plan view illustrating a display device according to yet another embodiment.
Figure 8:
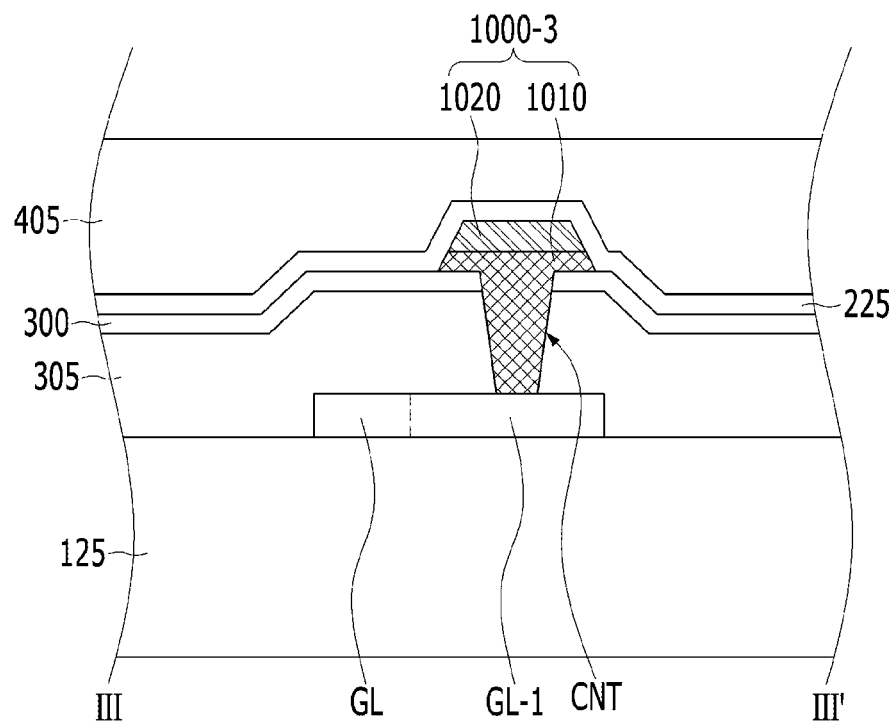
FIG. 8 is a longitudinal-sectional view taken along line of FIG. 7.

FIG. 7 is a plan view illustrating a display device according to yet another embodiment, and FIG. 8 is a longitudinal-sectional view taken along line of FIG. 7.

Here, a detailed description of some parts in this embodiment shown in FIGS. 7 and 8 which are substantially the same as those in the former embodiment shown in FIGS. 1 to 4 will be omitted because it is considered to be unnecessary, and FIGS. 1 to 4 will be cited for ease of description.

Referring to FIGS. 7 and 8, overlap patterns 1000-3 according to yet another embodiment may be disposed so as to be spaced apart from gate lines GL. Further, the overlap patterns 1000-3 may be disposed substantially parallel to the gate lines GL. Here, the gate line GL may include gate branch parts GL-1 which protrude from the length direction of the gate line GL towards the overlap pattern 1000-3.

The gate branch part GL-1 may have an overlap region OVA which overlaps a part of the overlap pattern 1000-3. A contact hole configured to connect the gate branch part GL-1 to the overlap pattern 1000-3 may be formed in the overlap region OVA.

Concretely, on an isolation insulating layer 300, a second active layer 220 may be disposed in a region in which a switching transistor 200 is disposed, and a overlap pattern 1010-3 may be disposed in a region in which a driving transistor 100 is formed. Further, the overlap pattern 1000-3 may be disposed on the isolation insulating layer 300 so as to be spaced apart from the gate line GL in a plane view. That is to say, the gate line GL and the overlap pattern 1000-3 may be disposed substantially parallel to each other in a plane view. Further, the gate line GL may include the gate branch parts GL-1 which protrude from the length direction of the gate line GL towards the overlap pattern 1000-3.

The overlap pattern 1000-3 may include the first overlap pattern 1010 and a second overlap pattern 1020 disposed on the isolation insulating layer 300. Some parts of the overlap pattern 1000-3 overlap the gate branch parts GL-1.

The first overlap pattern 1010 may be formed of substantially the same material as a material of a second active layer 220 disposed on the isolation insulating layer 300. The first overlap pattern 1010 and the second active layer 220 may be formed of an oxide semiconductor. The second overlap pattern 1020 may be formed of a single metal or a plurality of metals on the first overlap pattern 1010. The second overlap pattern 1020 may be formed of at least one of Mo/Ti, MoTi/Cu/MoTi, Mo/Al/Mo and Ti/Al/Ti.

The gate line GL and the overlap pattern 1000-3 may be disposed substantially parallel to each other in a plane view so as to be spaced apart from each other. Here, in order to connect the gate line GL to the overlap pattern 1000-3, the gate branch parts GL-1 protruding from the gate line GL may be disposed. Concretely, the gate branch parts GL-1 may be disposed so as to protrude from the length direction of the gate line GL towards the overlap pattern 1000-3. The gate branch parts GL-1 may be disposed so as to overlap some parts of the overlap pattern 1000-3.

The overlap pattern 1000-3 may have the overlap regions OVA, each of which overlaps a part of a corresponding one of the gate branch parts GL-1. The overlap pattern 1000-3 may be connected to the gate line GL through the contact holes CNT. The contact holes CNT may be formed through the isolation insulating layer 300 and a first interlayer insulating layer 305 in the overlap regions OVA in which the overlap pattern 1000-3 and the gate branch parts GL-1 of the gate line GL overlap each other. The contact holes CNT may be provided in plural so as to connect the overlap pattern 1000-3 and the gate branch parts GL-1 to each other. Although these figures illustrate the first interlayer insulating layer 305, the first interlayer insulating layer 305 may be selectively disposed on the isolation insulating layer 300.

The gate branch parts GL-1 may be disposed so as to be connected to the first overlap pattern 1010 through the contact holes CNT, and the second overlap pattern 1020 may be disposed on the first overlap pattern 1010.

As such, in the display device according to yet another embodiment, the overlap patterns 1000-3 are connected to the gate lines GL in the overlap regions OVA, in which the overlap patterns 1000-3 and the gate branch parts GL-1 overlap each other, through the contact holes CNT, thus being capable of serving as redundancies of the gate lines GL. That is, the overlap patterns 1000-3 are spaced from the gate lines GL and the gate branch parts GL-1 are disposed so as to selectively overlap the overlap patterns 100-3, and thus resistance of the gate lines GL may be reduced while having freedom in formation of the overlap patterns 1000-3, thereby being capable of coping with high-speed driving of the display device.

Therefore, in the display device according to yet another embodiment, the overlap patterns 1000-3 are spaced from the gate lines GL, and are connected to the gate lines GL by the gate branch parts GL-1, thus being capable of reducing resistance of the gate lines GL and thereby improving the driving speed of the display device.

Figure 9:
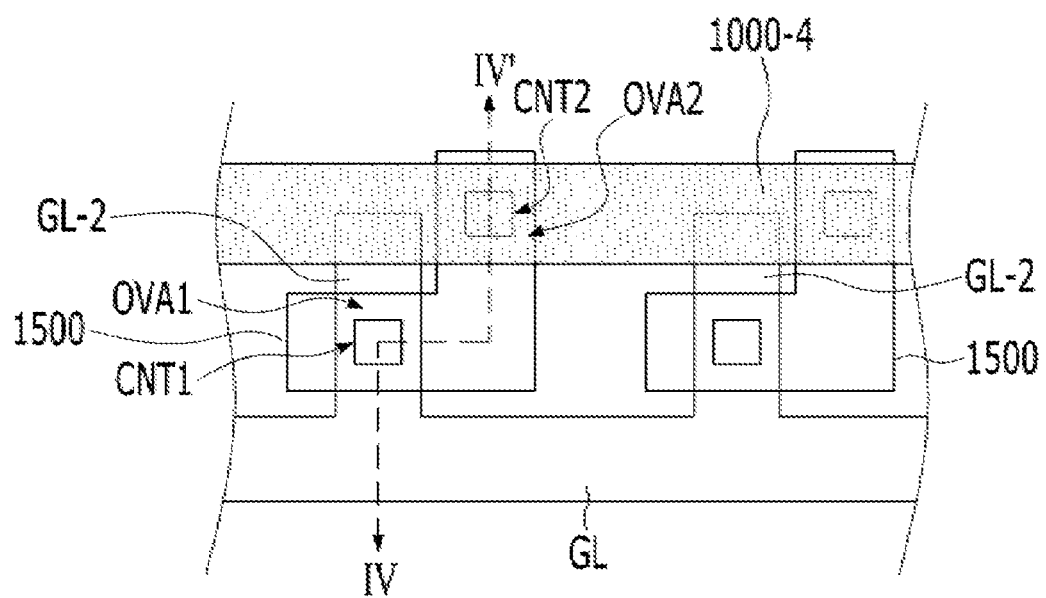
FIG. 9 is a plan view illustrating a display device according to still another embodiment.
Figure 10:
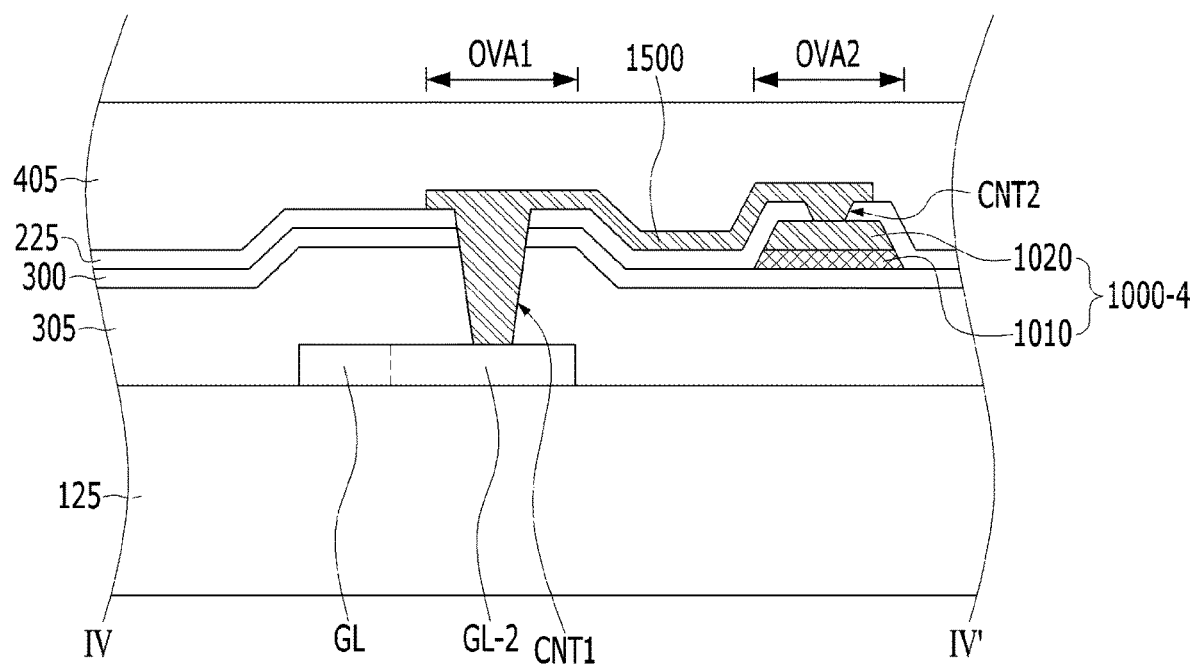
FIG. 10 is a longitudinal-sectional view taken along line IV-IV' of FIG. 9.

FIG. 9 is a plan view illustrating a display device according to still another embodiment, and FIG. 10 is a longitudinal-sectional view taken along line IV-IV' of FIG. 9.

Here, a detailed description of some parts in this embodiment shown in FIGS. 9 and 10 which are substantially the same as those in the former embodiment shown in FIGS. 1 to 4 will be omitted because it is considered to be unnecessary, and FIGS. 1 to 4 will be cited for ease of description.

Referring to FIGS. 9 and 10, overlap patterns 1000-4 according to still another embodiment may be disposed so as to be spaced apart from gate lines GL. Further, the overlap patterns 1000-4 may be disposed substantially parallel to the gate lines GL. Here, the gate line GL may include gate branch parts GL-2 which protrude from the length direction of the gate line GL towards the overlap pattern 1000-4.

Further, in the display device according to still another embodiment, connection patterns 1500 may be disposed so as to overlap the gate branch parts GL-2 and the overlap pattern 1000-4. Here, the connection patterns 1500 may be formed in the same layer as a second gate electrode 230. That is to say, the connection patterns 1500 may be formed simultaneously with the second gate electrode 230 on a second gate insulating layer 225.

The gate branch part GL-2 may have a region which overlaps a part of the overlap pattern 1000-4, or may not overlap the overlap pattern 1000-4. Although these figures illustrate the gate branch part GL-2 as having a region which overlaps a part of the overlap pattern 1000-4, no region of the gate branch part GL-2 may overlap the overlap pattern 1000-4.

The connection pattern 1500 may have a first overlap region OVA1 which overlaps the gate branch part GL-2. A first contact hole CNT1 may be formed in the first overlap region OVA1. The first contact hole CNT1 may connect the gate branch part GL-2 to the connection pattern 1500.

The connection pattern 1500 may have a second overlap region OVA2 which overlaps the overlap pattern 1000-4. A second contact hole CNT2 may be formed in the second overlap region OVA2. The second contact hole CNT2 may connect the overlap pattern 1000-4 to the connection pattern 1500.

Concretely, on an isolation insulating layer 300, a second active layer 220 may be disposed in a region in which a switching transistor 200 is disposed, and a overlap pattern 1000-4 may be disposed in a region in which a driving transistor 100 is formed. Further, the overlap pattern 1000-4 may be disposed on the isolation insulating layer 300 so as to be spaced apart from the gate line GL in a plane view. That is to say, the gate line GL and the overlap pattern 1000-4 may be disposed substantially parallel to each other in a plane view. Further, the gate line GL may include the gate branch parts GL-2 which protrude from the length direction of the gate line GL towards the overlap pattern 1000-4.

The overlap pattern 1000-4 may include the first overlap pattern 1010 and a second overlap pattern 1020 disposed on the isolation insulating layer 300. Some parts of the overlap pattern 1000-4 overlap the gate branch parts GL-2 so as to be connected thereto.

The first overlap pattern 1010 may be formed of substantially the same material as a material of the second active layer 220 disposed on the isolation insulating layer 300. The first overlap pattern 1010 and the second active layer 220 may be formed of an oxide semiconductor. The second overlap pattern 1020 may be formed of a single metal or a plurality of metals on the first overlap pattern 1010. The second overlap pattern 1020 may be formed of at least one of Mo/Ti, MoTi/Cu/MoTi, Mo/Al/Mo and Ti/Al/Ti.

The gate line GL and the overlap pattern 1000-4 may be disposed substantially parallel to each other in a plane so as to be spaced apart from each other. Here, in order to connect the gate line GL to the overlap pattern 1000-4, the connection patterns 1500 may be further disposed on the second gate insulating layer 225. One side of each of the connection patterns 1500 may overlap the overlap pattern 1000-4, and the other side of each of the connection patterns 1500 may overlap the gate branch part GL-2.

The connection patterns 1500 may be disposed in various shapes depending on the arrangement structure between the gate line GL and the overlap pattern 1000-4. In these figures, the overlap patterns 1000-4 and the gate branch parts GL-2 are disposed so as to be perpendicular to each other, and thus, in order to connect the gate branch parts GL-2 and the overlap pattern 1000-4 to each other, the connection patterns 1500 have a structure having a bending region.

The connection pattern 1500 may have the first overlap region OVA1 which overlaps a part of the gate branch part GL-2. In the first overlap region OVAL the gate branch part GL-2 may be connected to the connection pattern 1500 through the first contact hole CNT1.

The connection pattern 1500 may have the second overlap region OVA2 which overlaps a part of the overlap pattern 1000-4. In the second overlap region OVA2, the overlap pattern 1000-4 may be connected to the connection pattern 1500 through the second contact hole CNT2. Here, the connection pattern 1500 may be connected to the second overlap pattern 1020 of the overlap pattern 1000-4.

Therefore, the gate branch parts GL-2 and the overlap pattern 1000-4 may be connected to each other by the connection patterns 1500.

The first contact hole CNT1 may be formed through the second gate insulating layer 225, the isolation insulating layer 300 and a first interlayer insulating layer 305 in the first overlap region OVA1 in which the gate branch part GL-2 and the connection pattern 1500 overlap each other. The gate branch part GL-2 may be connected to the connection pattern 1500 through the first contact hole CNT1. Although these figures illustrate the first interlayer insulating layer 305, the first interlayer insulating layer 305 may be selectively disposed on the isolation insulating layer 300.

The second contact hole CNT2 may be formed through the second gate insulating layer 225 in the second overlap region OVA2 in which the overlap pattern 1000-4 and the connection pattern 1500 overlap each other. The overlap pattern 1000-4 may be connected to the connection pattern 1500 through the second contact hole CNT2.

As such, in the display device according to still another embodiment, the overlap patterns 1000-4 are connected to the gate branch parts GL2 by the connection patterns 1500, thus being capable of serving as redundancies of the gate lines GL. That is, the overlap patterns 1000-4 are spaced from the gate lines GL, and the connection electrodes 1500 are disposed so as to overlap the overlap pattern 1000-4 and the gate branch parts GL2 and thus connect the overlap pattern 1000-4 and the gate branch parts GL2 to each other, and thus resistance of the gate lines GL may be reduced while having freedom in formation of the overlap patterns 1000-4, thereby being capable of coping with high-speed driving of the display device.

Therefore, in the display device according to still another embodiment, the overlap patterns 1000-4 are spaced from the gate lines GL, and the gate branch parts GL-2 are connected to the overlap pattern 1000-4 by the connection patterns 1500, thus being capable of reducing resistance of the gate lines GL and thereby improving the driving speed of the display device.

Figure 11:
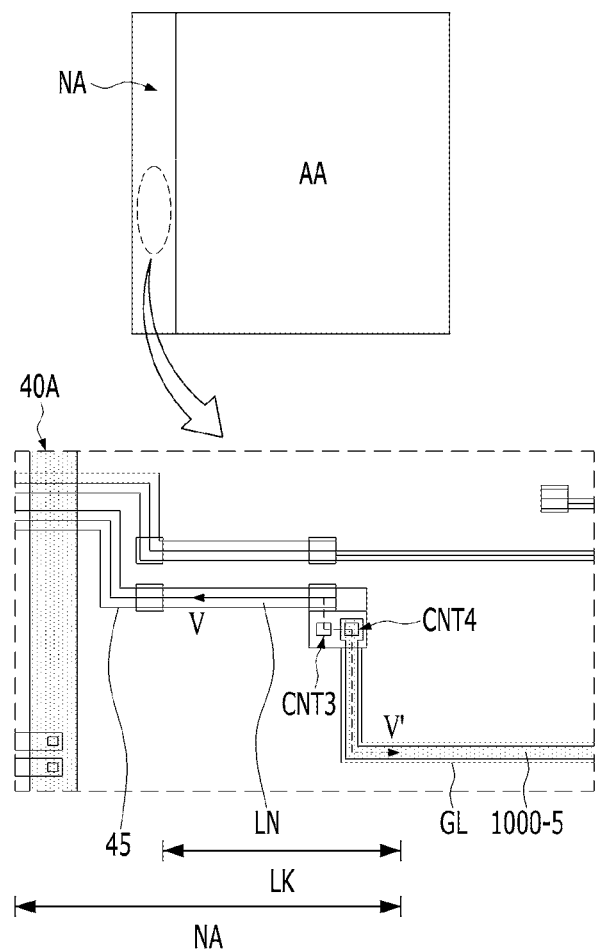
FIG. 11 is a plan view illustrating a display device according to still yet another embodiment.
Figure 12:
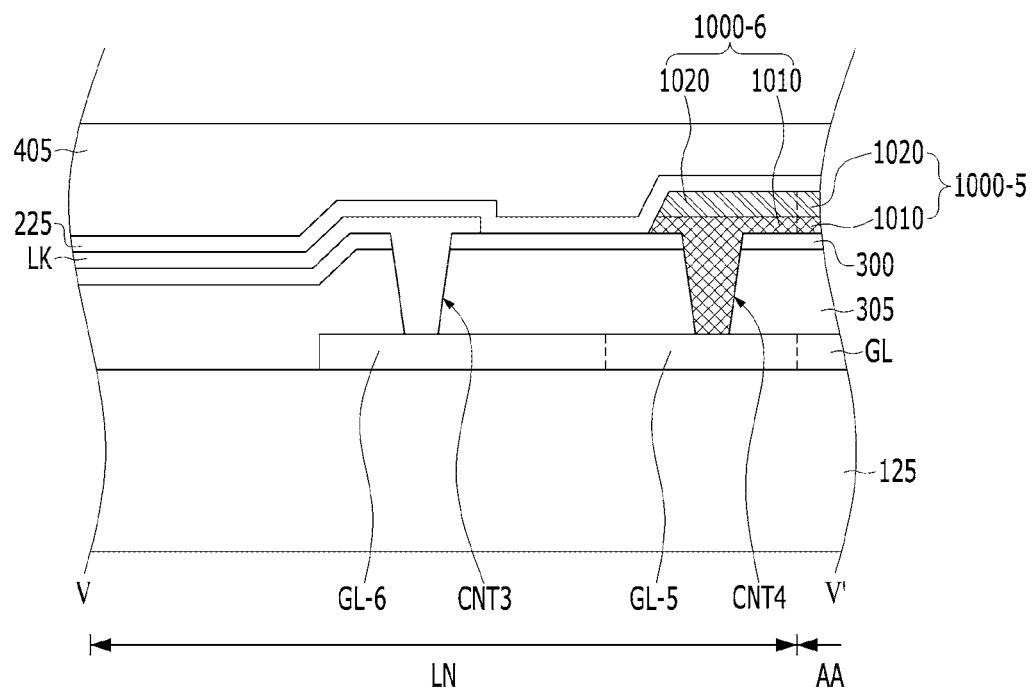
FIG. 12 is a longitudinal-sectional view taken along line V-V' of FIG. 11.

FIG. 11 is a plan view illustrating a display device according to still yet another embodiment, and FIG. 12 is a longitudinal-sectional view taken along line V-V' of FIG. 11.

Here, a detailed description of some parts in this embodiment shown in FIGS. 11 and 12 which are substantially the same as those in the former embodiment shown in FIGS. 1 to 4 will be omitted because it is considered to be unnecessary, and FIGS. 1 to 4 will be cited for ease of description.

Referring to FIGS. 11 and 12, the display device according to still yet another embodiment may include overlap patterns 1000-5 disposed in the active area AA, and extension overlap patterns 1000-6 disposed in the non-active area NA. Here, the non-active area NA may include a link region LK in which a gate driver 40A is connected to a display panel 10.

Link lines LN connected to output lines 45 drawn from the gate driver 40A may be disposed in the link region LK. Output lines 45 may be disposed on a first gate insulating layer 125 in the same manner as gate lines GL. Further, the link lines LN may be disposed on an isolation insulating layer 300 in the non-active area NA.

A first extension line GL-5 and a second extension line GL-6, which extend to the link region LK of the non-active area NA, may be formed integrally with the gate line GL.

Overlap patterns 1000-5 disposed in the active area AA may be disposed so as to overlap the gate lines GL.

In the link region LK of the non-active area NA, the extension overlap patterns 1000-6 extending from the overlap patterns 1000-5 to the link region LK may be disposed, and the extension overlap patterns 1000-6 may be disposed so as to overlap the first extension lines GL-5. In order to connect the extension overlap pattern 1000-6 to the first extension line GL-5, a fourth contact hole CNT4 may be disposed in a region in which the extension overlap pattern 1000-6 and the first extension line GL-5 overlap each other.

The first extension line GL-5 is disposed so as to be connected to the gate line GL, and the second extension line GL-6 is disposed so as to be connected to the first extension line GL-5.

Further, in the link region LK of the non-active area NA, the link line LN and the second extension line GL-6 may be disposed so as to overlap each other. In order to connect the link line LN to the second extension line GL-6, a third contact hole CNT3 may be disposed in a region in which the link line LN and the second extension line GL-6 overlap each other.

Concretely, on an isolation insulating layer 300 in the active area AA, a second active layer 220 may be disposed in a region in which a switching transistor 200 is disposed, and an overlap pattern 1000-5 may be disposed in a region in which a driving transistor 100 is formed. That is to say, the overlap patterns 1000-5 may be disposed on the isolation insulating layer 300 in the active area AA so as to overlap the gate lines GL.

Further, on the isolation insulating layer 300 in the non-active area NA, the link lines LN and the second extension lines GL-6 may be connected through the third contact holes CNT3, and the extension overlap patterns 1000-6 and the first extension lines GL-5 may be connected through the fourth contact holes CNT4.

The first overlap pattern 1010 may be formed of substantially the same material as a material of the second active layer 220 disposed on the isolation insulating layer 300. The first overlap pattern 1010 and the second active layer 220 may be formed of an oxide semiconductor. The second overlap pattern 1020 may be formed of a single metal or a plurality of metals on the first overlap pattern 1010. The second overlap pattern 1020 may be formed of at least one of Mo/Ti, MoTi/Cu/MoTi, Mo/Al/Mo and Ti/Al/Ti.

As such, in the display device according to still yet another embodiment, the overlap patterns 1000-5 are disposed so as to overlap the gate lines GL, the extension overlap patterns 1000-6 and the link lines LN are respectively connected to the first and second extension lines GL-5 and GL-6 disposed in the link region LK of the non-active area NA through the fourth and third contact holes CNT4 and CNT3, and thereby, the overlap patterns 1000-5 may serve as redundancies of the gate lines GL. That is, the overlap patterns 1000-5 are disposed so as to overlap the gate lines GL, the link lines LN and the extension overlap patterns 1000-6 are connected by the extension lines GL-5 and GL-6 in the non-active area NA, and thus resistance of the gate lines GL may be reduced while reducing a bezel size, thereby being capable of coping with high-speed driving of the display device.

Therefore, in the display device according to still yet another embodiment, the overlap patterns 1000-5 and the gate lines GL extend to the non-active area NA, so that the gate lines GL and the overlap patterns 1000-5 are connected to each other in the non-active area, thus being capable of reducing resistance of the gate lines GL and thereby improving the driving speed of the display device.

As is apparent from the above description, a display device according to one embodiment may reduce the resistance of a wiring having increased resistance by forming an overlap pattern disposed so as to overlap the wiring having increased resistance or disposed adjacent thereto, and then connecting the overlap pattern to the wiring having increased resistance, so as to improve driving speed.

Further, the display device according to one embodiment extends gate lines so as to be connected to the overlap patterns and link lines, thereby being capable of reducing a bezel size in addition to improving driving speed due to reduction in the resistance of the wiring.

It will be apparent to those skilled in the art that various modifications and variations can be made in the present disclosure and claimed features without departing from the spirit or scope of the disclosure. Thus, it is intended that the present disclosure and claims cover the modifications and variations.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate having an active area and a non-active area;
a light emitting device in the active area, the light emitting device having an anode, a cathode, and a light emission stack;
first thin film transistors, each of the first thin film transistors including:
a first active layer disposed in the active area,
a first gate insulating layer disposed on the first active layer,
a first gate electrode disposed on the first gate insulating layer and disposed to overlap the first active layer,
a first interlayer insulating layer provided on the first gate electrode, and
a first source electrode and a first drain electrode, each of the first source electrode and the first drain electrode connected to the first active layer;
a gate line formed integrally with the first gate electrode;
an isolation insulating layer disposed on the first interlayer insulating layer;
second thin film transistors disposed in the active area, each of the second thin film transistors including:
a second active layer disposed on the isolation insulating layer,
a second gate insulating layer disposed on the second active layer,
a second gate electrode disposed on the second gate insulating layer and disposed to overlap the second active layer,
a second interlayer insulating layer provided on the second gate insulating layer and the second gate electrode, and
a second source electrode and a second drain electrode, each of the second source electrode and the second drain electrode connected to the second active layer; and
an overlap pattern positioned to overlap the gate line and being connected to the gate line, the overlap pattern disposed on the isolation insulating layer and positioned under the anode, the overlap pattern including:
a first overlap pattern disposed on the isolation insulating layer and formed of substantially the same material as the second active layer; and
a second overlap pattern disposed on the first overlap pattern,
wherein the first overlap pattern and the second overlap pattern are distinct and different structures from each other and
wherein the first overlap pattern comprises an oxide semiconductor of different material from the first active layer.

2. The display device according to claim 1, wherein at least one contact hole configured to connect the first overlap pattern and the gate line to each other is disposed in the isolation insulating layer.

3. The display device according to claim 2, wherein the at least one contact hole is disposed in the active area.

4. The display device according to claim 1, wherein the first overlap pattern and the second active layer are disposed on a same layer and comprise the oxide semiconductor.

5. The display device according to claim 1, wherein the second overlap pattern is formed of at least one of Mo/Ti, MoTi/Cu/MoTi, Mo/Al/Mo or Ti/Al/Ti.

6. The display device according to claim 1, wherein the overlap pattern has a smaller width than a width of the gate line and the overlap pattern is completely overlapped by the gate line.

7. The display device according to claim 6, wherein the overlap pattern further comprises an overlap pattern line and an overlap pattern electrode, wherein:
the overlap pattern electrode is disposed to overlap the first gate electrode; and
the overlap pattern line is disposed to overlap the gate line.

8. The display device according to claim 1, wherein the gate line has a smaller width than a width of the overlap pattern and is completely overlapped by the overlap pattern.

9. The display device according to claim 1, wherein:
the overlap pattern and the gate line are spaced apart from each other and substantially parallel to each other;
gate branch parts are configured to protrude from a length direction of the gate line towards the overlap pattern; and
a contact hole configured to connect each of the gate branch parts to the overlap pattern is formed in a region in which each of the gate branch parts overlaps a part of the overlap pattern.

10. The display device according to claim 1, wherein:
the overlap pattern and the gate line are spaced apart from each other and substantially parallel to each other, and
gate branch parts are configured to protrude from a length direction of the gate line towards the overlap pattern; and
connection patterns are formed in the same layer as the second gate electrode,
wherein each of the connection patterns is configured to:
be connected to a corresponding one of the gate branch parts by a first contact hole formed in a first overlap region in which each of the connection patterns overlaps the corresponding one of the gate branch parts; and
be connected to the overlap pattern by a second contact hole formed in a second overlap region in which each of the connection patterns overlaps the overlap pattern.

11. The display device according to claim 10, wherein one side of each of the connection patterns is connected to the second overlap pattern of the overlap pattern in the second overlap region.

12. The display device according to claim 10, wherein the first contact hole is formed through the second gate insulating layer and the isolation insulating layer in the first overlap region.

13. The display device according to claim 10, wherein the second contact hole is formed through the second gate insulating layer in the second overlap region in which the overlap pattern and each of the connection patterns overlap each other.

14. The display device according to claim 10, wherein the second gate electrode and the connection patterns are disposed on the second gate insulating layer.

15. The display device according to claim 10, wherein the connection patterns connect the gate line and the overlap pattern to each other.

16. The display device according to claim 10, further comprising:
   a first extension line and a second extension line disposed in the active area, the first extension line and the second extension line each configured to extend from the gate line towards the non-active area;
   an extension overlap pattern disposed in the active area and overlapping the gate line, the extension overlap pattern configured to extend from the overlap pattern towards the non-active area to overlap the first extension line; and
   a link line disposed in a link region of the non-active area to overlap the second extension line,
   wherein the link region comprises:
   a third contact hole configured to connect the link line to the second extension line; and
   a fourth contact hole configured to connect the extension overlap pattern to the first extension line.

17. The display device according to claim 16, wherein the third contact hole and the fourth contact hole are formed through the isolation insulating layer.

18. The display device according to claim 16, wherein:
   the first extension line is disposed to be connected to the gate line; and
   the second extension line is disposed to be connected to the first extension line.

19. A display device, comprising:
   a substrate having an active area and a non-active area;
   a light emitting device in the active area, the light emitting device having an anode, a cathode and a light emission stack;
   first thin film transistors at the active area, each of the first thin film transistors including:
      a first active layer on the substrate,
      a first gate insulating layer on the first active layer,
      a first gate electrode on the first gate insulating layer and to overlap the first active layer,
      a first interlayer insulating layer provided on the first gate electrode, and
      a first source electrode and a first drain electrode, respectively connected to the first active layer;
   a gate line integrally with the first gate electrode;
   an isolation insulating layer on the first interlayer insulating layer;
   second thin film transistors at the active area, each of the second thin film transistors including:
      a second active layer on the isolation insulating layer,
      a second gate insulating layer on the second active layer,
      a second gate electrode on the second gate insulating layer and to overlap the second active layer, and
      a second source electrode and a second drain electrode, respectively connected to the second active layer; and
   an overlap pattern positioned to overlap the gate line and be positioned under the anode,
   wherein the overlap pattern is disposed on the isolation insulating layer and connected to the gate line through a contact hole in the isolation insulating layer and the first interlayer insulating layer,
   wherein the overlap pattern includes a first overlap pattern disposed on the isolation insulating layer and a second overlap pattern disposed on the first overlap pattern,
   wherein the first overlap pattern is made of a first material and the second overlap pattern is made of a second material that is different from the first material, and
   wherein the first overlap pattern comprises an oxide semiconductor of different material from the first active layer.

20. The display device according to claim 19, wherein the first overlap pattern is disposed in a same layer as the second active layer and the second overlap pattern includes a metal layer.

* * * * *